(12) United States Patent
Cabral, Jr. et al.

(10) Patent No.: US 9,299,639 B2
(45) Date of Patent: Mar. 29, 2016

(54) PATTERNING TRANSITION METALS IN INTEGRATED CIRCUITS

(71) Applicant: GLOBALFOUNDRIES INC., Grand Cayman (KY)

(72) Inventors: Cyril Cabral, Jr., Mahopac, NY (US); Sebastian U. Engelmann, New York, NY (US); Benjamin L. Fletcher, Elmsford, NY (US); Michael S. Gordon, Yorktown Heights, NY (US); Eric A. Joseph, White Plains, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 64 days.

(21) Appl. No.: 13/734,524

(22) Filed: Jan. 4, 2013

(65) Prior Publication Data

US 2014/0159242 A1 Jun. 12, 2014

Related U.S. Application Data

(63) Continuation of application No. 13/707,003, filed on Dec. 6, 2012.

(51) Int. Cl.
*H01L 23/48* (2006.01)
*H01L 29/45* (2006.01)
*H01L 21/768* (2006.01)
*H01L 23/532* (2006.01)
(Continued)

(52) U.S. Cl.
CPC ............ *H01L 23/48* (2013.01); *H01L 21/7685* (2013.01); *H01L 21/76852* (2013.01); *H01L 21/76885* (2013.01); *H01L 23/53252* (2013.01); *H01L 23/53266* (2013.01); *H01L 29/45* (2013.01); *B82Y 40/00* (2013.01); *B82Y 99/00* (2013.01); *H01L 2924/0002* (2013.01)

(58) Field of Classification Search
CPC .............. H01L 23/48; H01L 23/53252; H01L 23/53266; H01L 21/768; H01L 21/76885; H01L 21/7685; H01L 21/76852; H01L 29/45
USPC ................................. 257/761, 762, 763, 766
See application file for complete search history.

(56) References Cited

U.S. PATENT DOCUMENTS

| 5,751,067 | A | * | 5/1998 | Mikagi | ............. H01L 21/76852 257/764 |
|---|---|---|---|---|---|
| 6,084,302 | A | * | 7/2000 | Sandhu | ......................... 257/751 |
| 6,258,713 | B1 | | 7/2001 | Yu | |

(Continued)

*Primary Examiner* — Hung Vu
(74) *Attorney, Agent, or Firm* — Thompson Hine LLP

(57) ABSTRACT

An integrated circuit includes a plurality of semiconductor devices and a plurality of conductive lines connecting the semiconductor devices, wherein the conductive lines include a transition metal and a protective cap deposited on the transition metal. Alternatively, an integrated circuit includes a plurality of semiconductor devices and a plurality of conductive lines connecting the semiconductor devices and having sub-eighty nanometer pitches, wherein the conductive lines include a transition metal and a protective cap deposited on the transition metal, wherein the protective cap has a thickness between approximately five and fifteen nanometers. Alternatively, an integrated circuit includes a plurality of semiconductor devices and a plurality of conductive lines connecting the semiconductor devices and having sub-eighty nanometer line widths, wherein the conductive lines include a transition metal and a protective cap deposited on the transition metal, wherein the protective cap has a thickness between approximately five and fifteen nanometers.

20 Claims, 5 Drawing Sheets

(51) Int. Cl.
  *B82Y 99/00* (2011.01)
  *B82Y 40/00* (2011.01)

(56) References Cited

U.S. PATENT DOCUMENTS

| | | | |
|---|---|---|---|
| 6,828,230 B2 * | 12/2004 | Schoenfeld et al. | 438/643 |
| 6,908,847 B2 | 6/2005 | Saito | |
| 6,939,791 B2 | 9/2005 | Geffken | |
| 7,084,062 B1 | 8/2006 | Avanzino | |
| 7,190,079 B2 | 3/2007 | Andricacos | |
| 7,514,361 B2 | 4/2009 | Bonilla | |
| 7,772,028 B2 | 8/2010 | Adkisson | |
| 7,928,003 B2 * | 4/2011 | Naik | H01L 21/31144 438/624 |
| 8,003,536 B2 | 8/2011 | Chapple-Sokol | |
| 2008/0050879 A1 | 2/2008 | Hung et al. | |
| 2012/0043657 A1 * | 2/2012 | Luoh et al. | 257/751 |

* cited by examiner

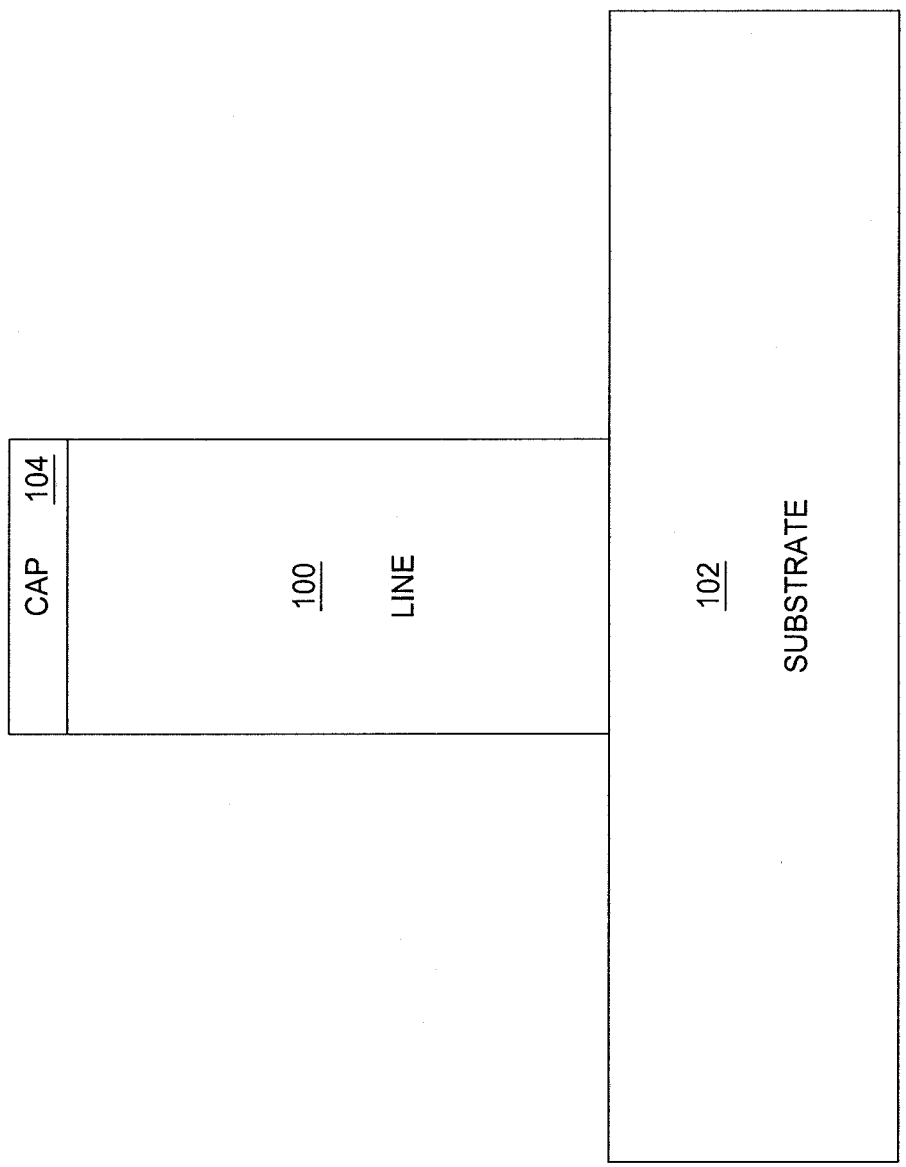

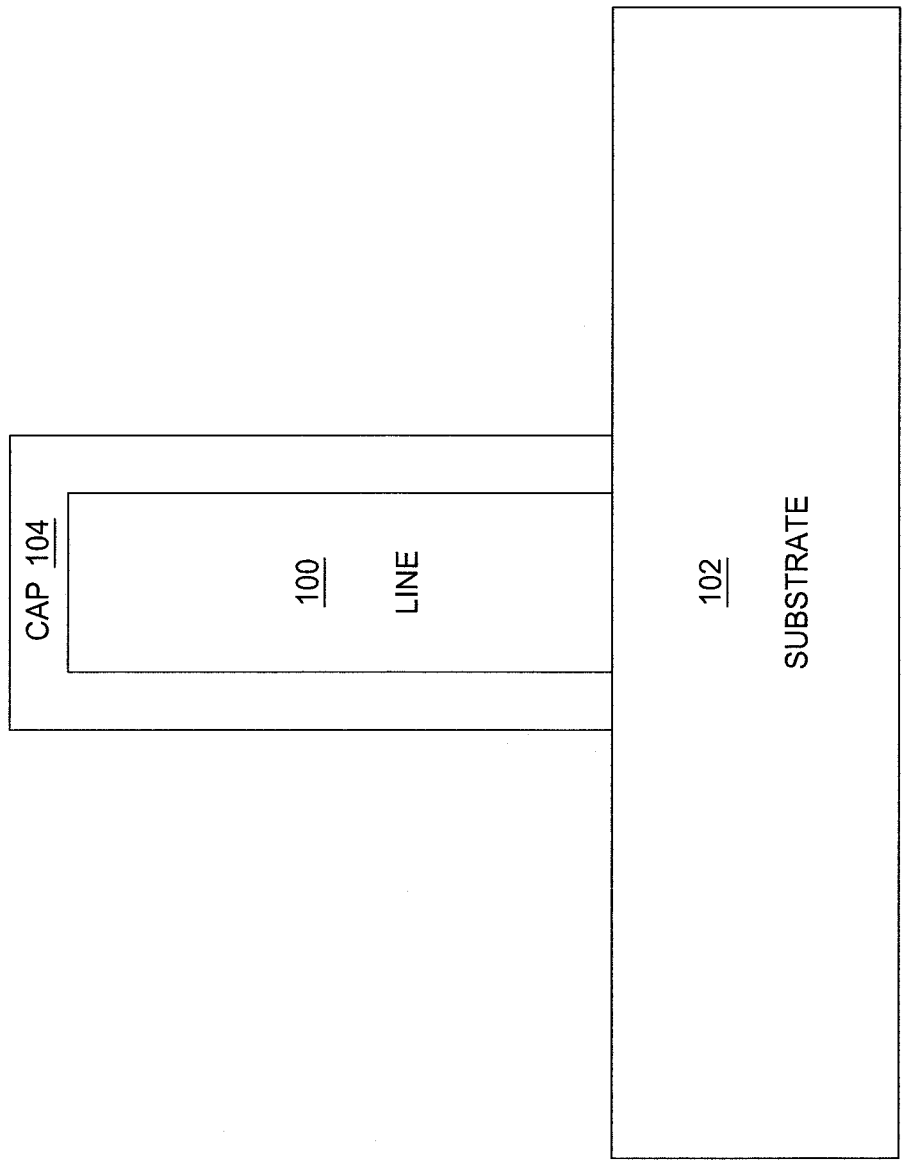

PATTERNING TRANSITION METALS IN INTEGRATED CIRCUITS

CROSS REFERENCE TO RELATED APPLICATIONS

This application is a continuation of co-pending U.S. patent application Ser. No. 13/707,003, filed Dec. 6, 2012, which is herein incorporated by reference in its entirety.

BACKGROUND OF THE INVENTION

The present invention relates generally to integrated circuits and relates more specifically to metal patterning processes for use in manufacturing integrated circuits.

Integrated circuits (ICs) commonly use copper interconnects (or "lines") to connect transistors and other semiconductor devices on the ICs. As the size of these interconnects scales down, however, challenges in the manufacturing process increase. For instance, at the thirty-two nanometer node, one may have to contend with incomplete fills during electroplating, damage to the dielectric during trench reactive ion etching (RIE), and shorting due to difficulties associated with line capping. Further scaling of the interconnects not only exacerbates these problems, but also introduces new problems.

Moreover, even assuming that the technical hurdles associated with manufacturing can be overcome, it is expected that at some dimension, the copper will simply fail to conduct electricity effectively.

SUMMARY OF THE INVENTION

One embodiment of an integrated circuit includes a plurality of semiconductor devices and a plurality of conductive lines connecting the semiconductor devices, wherein at least some of the conductive lines include a layer of a transition metal and a protective cap deposited on the layer of the transition metal.

Another embodiment of an integrated circuit includes a plurality of semiconductor devices and a plurality of conductive lines connecting the semiconductor devices and having sub-eighty nanometer pitches, wherein at least some of the conductive lines include a layer of a transition metal and a protective cap deposited on the layer of the transition metal, wherein the protective cap has a thickness between approximately five and fifteen nanometers.

Another embodiment of an integrated circuit includes a plurality of semiconductor devices and a plurality of conductive lines connecting the semiconductor devices and having sub-eighty nanometer line widths, wherein at least some of the conductive lines include a layer of a transition metal and a protective cap deposited on the layer of the transition metal, wherein the protective cap has a thickness between approximately five and fifteen nanometers.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A-1B are schematic diagrams illustrating embodiments of a metal interconnect or line, according to the present invention;

DETAILED DESCRIPTION

Figure 2B:
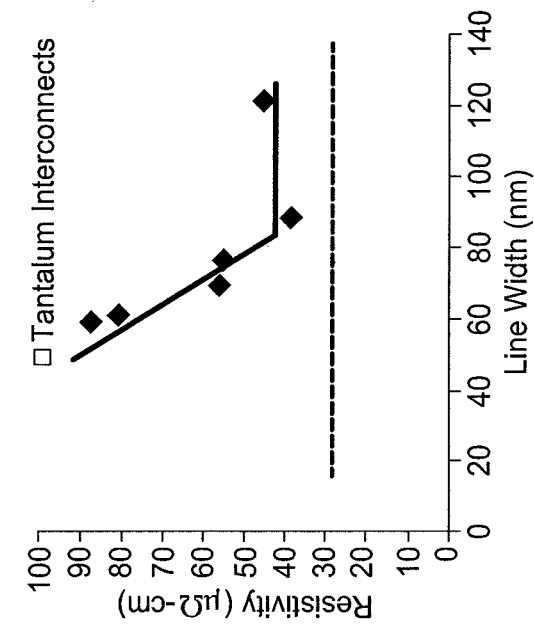
FIGS. 2A-2B are line graphs plotting the resistivity of various transition metals versus line width.

In one embodiment, the invention is a method and apparatus for patterning transition metals in integrated circuits (ICs). Embodiments of the invention produce metal interconnects having very small dimensions (e.g., sub-eighty nanometer line widths and sub-eighty nanometer pitches) from transition metals (i.e., elements in at least the d-block of the periodic table, which includes groups 3 through 12 on the periodic table, and in some cases certain metals in the f-block such as the lanthanide and actinide series). Thus, in some embodiments, the interconnects may be formed form any one or more of: scandium, titanium, vanadium, chromium, manganese, iron, cobalt, nickel copper, zinc, yttrium, zirconium, niobium, molybdenum, ruthenium, rhodium, palladium, silver, hafnium, tantalum, tungsten, rhenium, osmium, iridium, platinum, gold, lanthanum, cerium, praseodymium, neodymium, promethium, samarium, europium, gadolinium, terbium, dysprosium, holmium, erbium, thulium, ytterbium, or lutetium, and alloys thereof. In one embodiment, the transition metal is a non-copper transition metal.

The relatively low electron mean free paths of the transition metals (e.g., on the order of five to ten nanometers versus thirty-nine nanometers for copper) allow the transition metals to effectively conduct electricity at the interconnect dimensions beyond the thirty-two nanometer node, thus completely bypassing the physical limitations of conventional copper interconnects. Manufacturing problems relating to capping, dielectric reactive ion etch, and electroplating fill are largely avoided. Transition metals have the additional advantage of readily forming volatile species in reactive ion chemistries, whereas copper does not readily form volatile species in reactive ion chemistries (and thus cannot easily be etched in reactive ion chemistries).

In one particular embodiment, the transition metal interconnects are capped with a protective material that minimizes contamination from standard fabrication processes (e.g., reactive ion etching, dielectric deposition, or the like). Typically, the transition metals would be highly susceptible to such contamination when fabricated with small (e.g., sub-forty nanometer) dimensions. For instance, contamination by oxygen has a particularly significant impact on the conductive properties of transition metals. Although the volume of oxidized metal remains constant, the top of a transition metal line will be more oxidized than the rest of the line due to the directional nature of certain standard fabrication processes (e.g., reactive ion etching). The oxygen thus enters the line from the top and then diffuses through the line to the bottom interface.

FIGS. 1A-1B are schematic diagrams illustrating embodiments of a metal interconnect or line 100, according to the present invention. Although FIGS. 1A-1B illustrate only a single line 100 for the sake of simplicity, it will be appreciated that an IC will be composed of many such lines. For instance, the IC may comprise a substrate or die whose back end includes insulating materials (e.g., dielectrics) and a plurality of conductive metal lines connected, for example, by vias. The lines may transport signals to semiconductor devices in the front end of the IC or may provide supply voltages, ground, and signals travelling off of the IC.

FIG. 1A generally illustrates a substrate (or die) 102, upon which a multilayer interconnect structure including the line 100 is formed. The substrate 102 may comprise, for example, crystalline silicon, gallium arsenide (GaAs), or other semiconductors, as well as other materials for forming transistors, resistors, capacitors, and other structures.

The line 100 comprises a layer of conductive metal. In one embodiment, the conductive metal is at least one transition metal (i.e., an element from at least the d-block of the periodic table, which includes groups 3 through 12 on the periodic table, and in some cases certain metals in the f-block such as the lanthanide and actinide series). In one embodiment, the line 100 has very small dimensions (e.g., sub-eighty nanometer line widths and/or sub-eighty nanometer pitches). In a further embodiment, the line has a sub-thirty nanometer line width.

A cap 104 is additionally deposited on the layer of conductive metal. In one embodiment, the cap 104 comprises a layer of protective material, such as titanium nitride (TiN), tantalum nitride (TaN), or other refractory metal nitrides. In one embodiment, the cap 104 is deposited by atomic layer deposition. In one embodiment, the cap 104 has a thickness between approximately five and fifteen nanometers. In general, the greater the thickness of the cap 104, the less sharply the resistivity of the line 100 increases relative to line width. In other words, the greater the thickness of the cap 104, the more consistent the resistivity of the line. Thus, a thin cap 104 renders what might be an otherwise highly resistive line 100 conductive. The properties of importance in the cap 104 include the ability to provide a diffusion barrier to oxygen, carbon, and nitrogen, relatively low resistivity, and the ability to be easily patterned with reactive ion etching.

As illustrated in FIG. 1A, the cap 104 may be deposited over only a single side (e.g., the top) of the line 100. Alternatively, as illustrated in FIG. 1B, the cap 104 may fully encapsulate the line 100 (e.g., is deposited over three sides of the line 100 excluding the line/substrate interface). Fully encapsulating the line 100 with the cap 104 further enhances the conductivity of the line 100. In this case, the thickness of the cap 104 is similar to what it would be if the cap 104 were deposited on only a single side of the line 100 (e.g., between approximately five and fifteen nanometers).

Figure 2A:
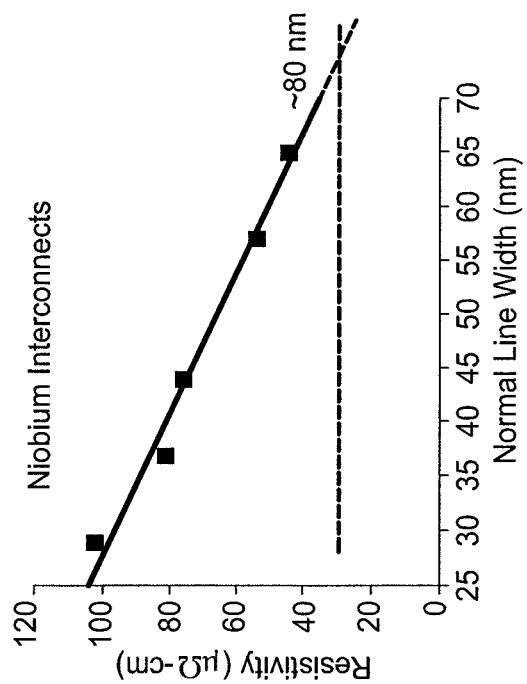

FIGS. 2A-2B are line graphs plotting the resistivity of various transition metals versus line width. In particular, FIG. 2A plots resistivity versus line width for niobium interconnects, whereas FIG. 2B plots resistivity versus line width for tantalum interconnects. As illustrated, resistivity tends to increase linearly as the interconnect dimensions (e.g., variable line width, constant thickness, length) are reduced, and the resistivity is particularly high at sub-eighty nanometer line widths. For instance, niobium interconnects having approximately eighty nanometer line widths have been shown to exhibit thin film resistivities of approximately thirty micro ohm-centimeters. The thin film resisitivity increases greatly as the line width is reduced (e.g., beyond one hundred micro ohm-centimeters at line widths of approximately twenty-five nanometers in the illustrated example). Tantalum interconnects having approximately eighty nanometer line widths have been shown to exhibit thin film resistivities of approximately twenty-eight micro ohm-centimeters. As before, the thin film resisitivity increases greatly as the line width is reduced (e.g., beyond ninety micro ohm-centimeters at line widths of approximately forty-five nanometers in the illustrated example)

Figure 3:
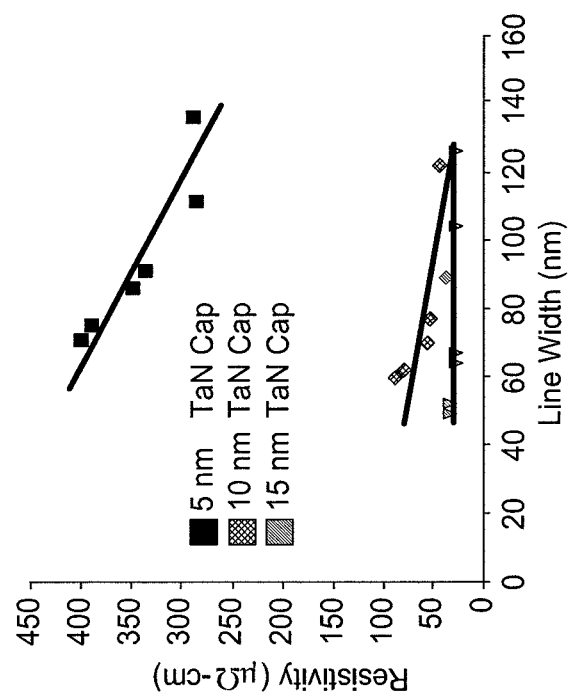
FIG. 3 is a line graph plotting the resistivity versus line width of a transition metal line that has been capped with tantalum nitride according to embodiments of the present invention.

By contrast, FIG. 3 is a line graph plotting the resistivity versus line width of a transition metal line that has been capped with tantalum nitride according to embodiments of the present invention. In particular, FIG. 3 plots the resistivity versus line width of the capped transition metal line for various cap thicknesses (i.e., five, ten, and fifteen nanometers). As illustrated, the capped transition metal line is much more conductive than the uncapped lines referenced in FIGS. 2A-2B, and the conductivity improves with the thickness of the cap 104.

For instance, a line having an approximately eighty nanometer line width and a cap approximately five nanometers thick exhibits a resistivity of approximately three hundred fifty micro ohm-centimeters. Reducing the line width to approximately sixty nanometers and maintaining the five nanometer thick cap results in a resistivity of approximately four hundred micro ohm-centimeters. A line having an approximately eighty nanometer line width and a cap approximately ten nanometers thick exhibits a resistivity of approximately sixty micro ohm-centimeters. Reducing the line width to approximately sixty nanometers and maintaining the ten nanometer thick cap results in a resistivity of approximately seventy-five micro ohm-centimeters. A line having an approximately eighty nanometer line width and a cap approximately fifteen nanometers thick exhibits a resistivity of approximately thirty micro ohm-centimeters. Reducing the line width to approximately sixty nanometers and maintaining the fifteen nanometer thick cap results in a resistivity of approximately thirty micro ohm-centimeters; thus, there is a nominal (if any) change in resistivity between eighty and sixty nanometer line widths when the cap is fifteen nanometers thick. Thus, as the thickness of the cap is increased, the increase in resistivity becomes much less dramatic as the line width is reduced.

Figure 4:
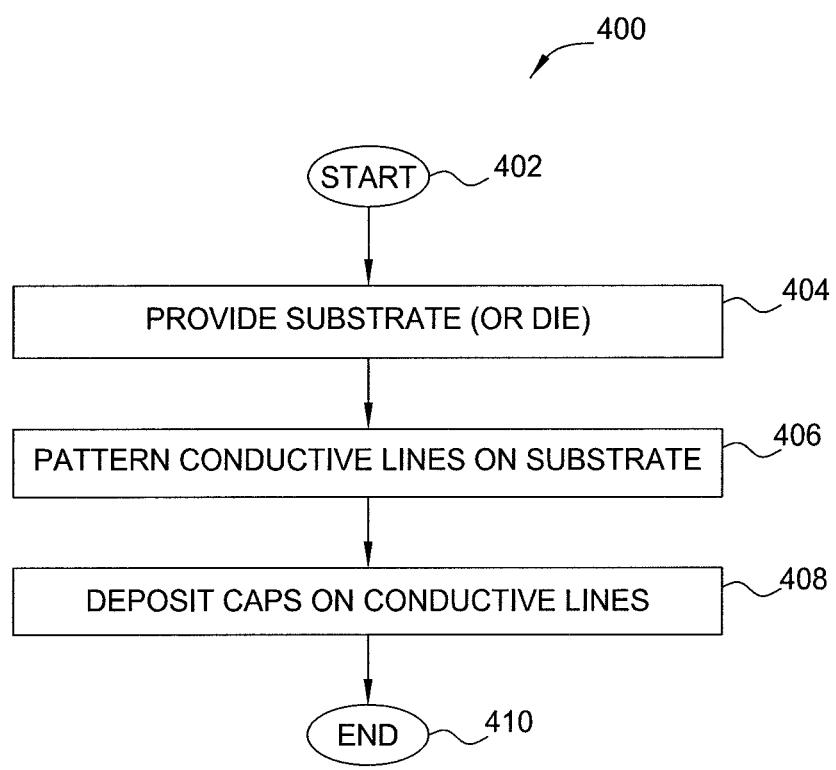
FIG. 4 is a flow diagram illustrating one embodiment of a method 400 for patterning a transition metal in an integrated circuit, according to the present invention.

FIG. 4 is a flow diagram illustrating one embodiment of a method 400 for patterning a transition metal in an integrated circuit, according to the present invention. For the sake of simplicity, various well-known metal patterning steps have been omitted so that the discussion is focused on the advantages of the present invention. Thus, FIG. 4 represents only a sub-process in the overall integrated circuit fabrication process.

The method 400 begins in step 402. In step 404, a substrate (or die) is provided. As described above, the substrate may comprise, for example, crystalline silicon, gallium arsenide (GaAs), or other semiconductors, as well as other materials for forming transistors, resistors, capacitors, and other structures.

In step 406, fine conductive metal lines are patterned on the substrate. In one embodiment, the conductive metal lines are formed from a transition metal (i.e., an element from at least the d-block of the periodic table, which includes groups 3 through 1 on the periodic table, and in some cases certain metals in the f-block such as the lanthanide and actinide series). In one embodiment, the conductive metal lines have very small dimensions (e.g., sub-eighty nanometer line widths and/or sub-eighty nanometer pitches). In a further embodiment, the conductive metal lines have sub-thirty nanometer line widths. In one embodiment, the conductive metal lines are patterned using a subtractive process (i.e., a process that creates a desired structure by removing material rather than by adding material).

In step 408, caps are deposited on the conductive metal lines. In one embodiment, the caps comprise layers of protective material, such as a refractory metal nitride like titanium nitride (TiN) or tantalum nitride (TaN). As discussed above, the caps may be deposited over only single sides (e.g., the tops) of the lines, or may alternatively fully encapsulate the lines (e.g., aside from line/substrate interfaces). In one embodiment, the caps are deposited by atomic layer deposition. In one embodiment, the caps have thicknesses between approximately five and fifteen nanometers.

The method 400 ends in step 410.

Embodiments of the invention therefore produce metal interconnects having very small dimensions (e.g., sub-eighty nanometer line widths and sub-eighty nanometer pitches) from transition metals that effectively conduct electricity at the interconnect dimensions beyond the thirty-two nanometer node, thus completely bypassing the physical limitations of conventional copper interconnects. Manufacturing problems relating to capping, dielectric reactive ion etch, and electroplating fill are largely avoided.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. An integrated circuit, comprising:
   a plurality of semiconductor devices; and
   a plurality of conductive lines connecting the plurality of semiconductor devices, wherein at least some of the plurality of conductive lines have sub-eighty nanometer line widths, and wherein the at least some of the plurality of conductive lines comprise:
      a layer of a non-copper transition metal, wherein the layer of the non-copper transition metal conducts a majority of an electrical current between devices in the integrated circuit; and
      a protective cap deposited on the layer of the non-copper transition metal, wherein the protective cap is deposited to a thickness that reduces a resistivity of the at least some of the plurality of conductive lines to within a range of thirty-two to four hundred micro ohm-centimeters.

2. The integrated circuit of claim 1, wherein the one or more conductive lines have sub-eighty nanometer pitches.

3. The integrated circuit of claim 1, wherein the non-copper transition metal comprises tantalum.

4. The integrated circuit of claim 1, wherein the non-copper transition metal comprises titanium.

5. The integrated circuit of claim 1, wherein the non-copper transition metal comprises vanadium.

6. The integrated circuit of claim 1, wherein the non-copper transition metal comprises hafnium.

7. The integrated circuit of claim 1, wherein the non-copper transition metal comprises cobalt.

8. The integrated circuit of claim 1, wherein the non-copper transition metal comprises nickel.

9. The integrated circuit of claim 1, wherein the non-copper transition metal comprises zirconium.

10. The integrated circuit of claim 1, wherein the non-copper transition metal comprises niobium.

11. The integrated circuit of claim 1, wherein the non-copper transition metal comprises tungsten.

12. The integrated circuit of claim 1, wherein the protective cap encapsulates three sides of the layer of the non-copper transition metal.

13. The integrated circuit of claim 1, wherein the protective cap has a thickness between approximately five and fifteen nanometers.

14. The integrated circuit of claim 1, wherein the protective cap comprises a refractory metal nitride.

15. The integrated circuit of claim 14, wherein the refractory metal nitride comprises tantalum nitride.

16. The integrated circuit of claim 14, wherein the refractory metal nitride comprises titanium nitride.

17. The integrated circuit of claim 1, wherein the at least some of the plurality of conductive lines have line widths between sixty and eighty nanometers, the protective cap has a thickness of five nanometers, and the at least some of the plurality of conductive lines have resistivities between three hundred fifty and four hundred micro ohm-centimeters.

18. The integrated circuit of claim 1, wherein the at least some of the plurality of conductive lines have line widths between sixty and eighty nanometers, the protective cap has a thickness of ten nanometers, and the at least some of the plurality of conductive lines have resistivities between sixty and seventy-five micro ohm-centimeters.

19. The integrated circuit of claim 1, wherein the at least some of the plurality of conductive lines have line widths between sixty and eighty nanometers, the protective cap has a thickness of fifteen nanometers, and the at least some of the plurality of conductive lines have resistivities of thirty micro ohm-centimeters.

20. An integrated circuit, comprising:
   a plurality of semiconductor devices; and
   a plurality of conductive lines connecting the plurality of semiconductor devices, wherein at least some of the plurality of conductive lines have sub-eighty nanometer line widths and resistivities within a range of thirty-two to four hundred micro ohm-centimeters, and wherein the at least some of the plurality of conductive lines comprise:
      a layer of a non-copper transition metal, wherein the layer of the non-copper transition metal conducts a majority of an electrical current between devices in the integrated circuit.

* * * * *